United States Patent [19]

Clark et al.

[11] Patent Number: 5,281,832
[45] Date of Patent: Jan. 25, 1994

[54] BIDIRECTIONAL TWO-TERMINAL THYRISTOR

[75] Inventors: Lowell E. Clark, Phoenix; James R. Washburn, Scottsdale, both of Ariz.

[73] Assignee: Motorola, Inc., Schaumburg, Ill.

[21] Appl. No.: 902,251

[22] Filed: Jun. 22, 1992

[51] Int. Cl.⁵ ............................................. H01L 29/74
[52] U.S. Cl. .................................. 257/109; 257/154; 257/163; 257/164; 257/653
[58] Field of Search ............... 257/109, 154, 163, 164, 257/177, 653

[56] References Cited

U.S. PATENT DOCUMENTS 5,040,042  8/1991  Bauer et al. .......................... 357/38

FOREIGN PATENT DOCUMENTS 0194936  9/1986  European Pat. Off. ............ 257/109

Primary Examiner—Ngan Ngo
Attorney, Agent, or Firm—Rennie William Dover; Joe E. Barbee

[57] ABSTRACT

A bidirectional two-terminal ungated thyristor (9) having two wide-base portions (25, 27). The bidirectional two-terminal ungated thyristor (9) has a first semiconductor device having a first narrow-base portion (28) in series with a first wide-base portion (25), and a second semiconductor device having a second narrow-base portion (26) in series with a second wide-base portion (27). A width of the first wide base portion (25) and a width of the second wide base portion (27) are decreased to decrease a total base width. The first and second wide-base portions (25, 27) having a decreased width produce a low forward voltage drop across the bidirectional two-terminal ungated thyristor (9); thus, improving a power dissipation capability of the bidirectional two-terminal ungated thyristor (9).

8 Claims, 1 Drawing Sheet

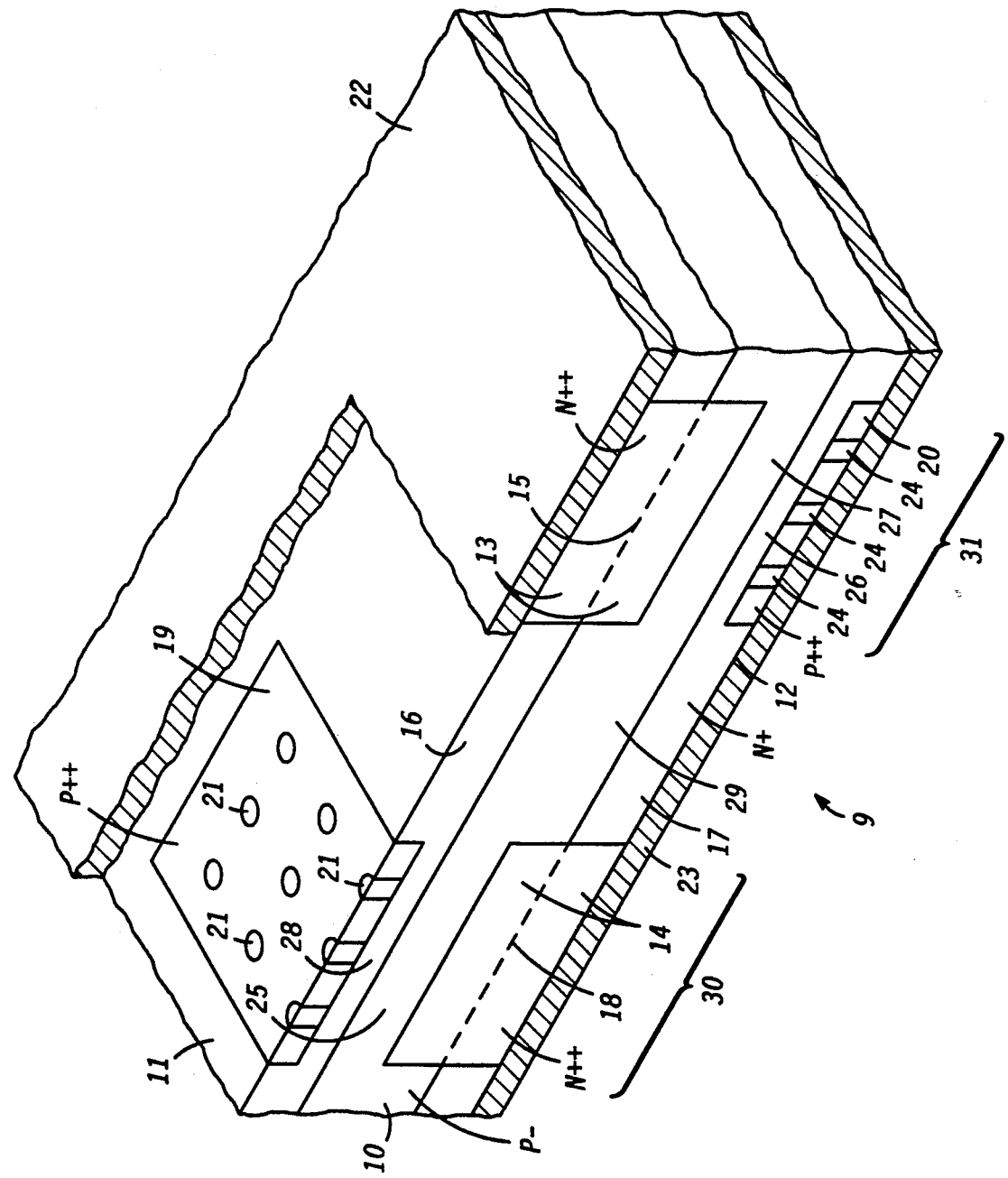

BIDIRECTIONAL TWO-TERMINAL THYRISTOR

BACKGROUND OF THE INVENTION

This invention relates, in general, to thyristors and, more particularly, to bidirectional two-terminal thyristors.

In general, thyristors are a family of four layer PNPN type devices that function as switches in power control applications. Thyristors are available as unidirectional and bidirectional devices. A power dissipation of a unidirectional thyristor may be lowered by narrowing a width of its wide-base region. The wide-base region may be narrowed by, for example, fabricating the unidirectional thyristor in a thin semiconductor substrate.

The narrower wide-base region provides a lower forward voltage drop across the unidirectional thyristor; thereby permitting an increase in its current carrying capability while allowing an acceptable power dissipation. Lowering the power dissipation of a bidirectional thyristor by using the thin semiconductor substrate is unfeasible because of the fragility of the semiconductor substrate for practical thicknesses. Accordingly, it would be advantageous to have a method for decreasing a forward voltage drop, commonly referred to as an on-state voltage drop, without compromising a structural integrity of the semiconductor substrate.

SUMMARY OF THE INVENTION

Briefly stated, the present invention is a method for forming a bidirectional thyristor. The method comprises forming a first base well in a second side of a semiconductor substrate and a second base well in a first side of the semiconductor substrate. The first base well is laterally spaced from the second base well. A first base layer is formed on the first side of the semiconductor substrate and a second base layer is formed on the second side of the semiconductor substrate. A depth of the first base layer is less than a depth of the second base well, and a depth of the second base layer is less than a depth of the first base well. A first emitter well is formed in the first base layer, the first emitter well is laterally spaced from the second base well and directly opposite the first base well. A second emitter well is formed in the second base layer, the second emitter well is laterally spaced from the first base well and directly opposite the first base well. A depth of the first emitter well is less than the depth of the first base layer, and a depth of the the second emitter well is less than a depth of the second base layer. A layer of conductive material is common to the second base well, the first emitter well, and the first base layer, and a layer of conductive material is common to the first base well, the second emitter well, and the second base layer.

BRIEF DESCRIPTION OF THE DRAWING

The single figure illustrates a highly enlarged cross-sectional perspective view of a portion of a bidirectional two-terminal ungated thyristor in accordance with the present invention.

DETAILED DESCRIPTION OF THE DRAWING

A typical prior art bidirectional two-terminal ungated thyristor includes a forward conducting region and a reverse conducting region. Each conducting region has a base comprising a wide-base portion of a uniform thickness and a narrow-base portion. One method for lowering a voltage drop across the base region is to narrow the wide-base portion by using a thin semiconductor substrate. However, a lower limit of a thickness of the semiconductor substrate arises due to the fragility of the semiconductor substrate.

The single figure illustrates a highly enlarged cross-sectional perspective view of a portion of a bidirectional two-terminal ungated thyristor 9 in accordance with the present invention; wherein, the present invention teaches decreasing a thickness of the base region. It shall be understood that thyristor 9 is a symmetric bidirectional semiconductor device having two symmetric regions, thus thyristor 9 lacks a top portion and a bottom portion. However, for the sake of explanation, thyristor 9 will be described in terms of top and bottom portions with reference to the single figure. A base well 13 is distinguished from a base well 14 by the terms top and bottom, thus base well 13 is described as top base well 13 and base well 14 is described as bottom base well 14. Similarly, base layer 16 is described as top base layer 16, base layer 17 is described as bottom base layer 17, emitter well 19 is described as top emitter well 19, and emitter well 20 is described as bottom emitter well 20. The terms top and bottom are merely to distinguish between wells and layers and does not limit positions of the wells and layers.

Thyristor 9 includes a semiconductor substrate 10 of a first conductivity type comprising two major opposed surfaces 11 and 12. A top base layer 16 and a bottom base layer 17 contiguous to major surfaces 11 and 12, respectively, extend into semiconductor substrate 10. A top base well 13 and a bottom base well 14 extend from major surfaces 11 and 12, respectively, through the respective base layers 16 and 17, and into semiconductor substrate 10. Base wells 13 and 14 are laterally spaced from each other and are formed on opposite sides of semiconductor substrate 10. Base layers 16 and 17, and base wells 13 and 14 have an opposite conductivity type to semiconductor substrate 10.

A top emitter well 19 and a bottom emitter well 20 are contiguous to major surfaces 11 and 12, respectively, and extend into the respective base layers 16 and 17. Portions of emitter wells 19 and 20 distal from major surfaces 11 and 12, respectively, form outer peripheral portions of impurity wells 19 and 20. Top emitter well 19 is laterally spaced from bottom emitter well 20, and located directly opposite base well 14. Bottom emitter well 20 is located directly opposite top base well 13.

A plurality of fingers 21, contiguous to major surface 11, extend through top emitter well 19. Preferably the plurality of fingers are a portion of top base layer 16 and serve as shorting structures. Further, a plurality of fingers 24, contiguous to major surface 12, extend through bottom emitter well 20. Preferably the plurality of fingers are a portion of bottom base layer 17 and serve as shorting structures. The plurality of fingers 21 and 24 electrically connect base layers 16 and 17 with layers of conductive material 22 and 23, respectively. Layers of conductive material 22 and 23 serve as conductors. Conductor 22 is common to top base well 13, top base layer 16, top emitter well 19, and the plurality of fingers 21. Conductor 23 is common to bottom base well 14, bottom base layer 17, bottom emitter well 20, and the plurality of fingers 24. Although conductor 22 extends over top impurity well 19, in the single figure a portion of the layer of conductive material 22 is cut away to illustrate emitter shorting regions 21.

Bidirectional thyristor 9 is laterally divided into two regions 30 and 31 which serve as a forward conducting region, and a reverse conducting region. A coupling layer 29 extends continuously through regions 30 and 31. Because bidirectional thyristor 9 is a symmetric structure, a definition of the forward and reverse conducting regions is dependent on a biasing configuration of bidirectional thyristor 9 and a conductivity type of substrate 10, base wells 13 and 14, base layers 16 and 17, and emitter wells 19 and 20. For example, region 30 is defined as the forward conducting region and region 31 is defined as the reverse conducting region in bidirectional thyristor 9 of the present invention having a substrate 10 of P conductivity type and biased such that conductor 22 is at a higher voltage potential than conductor 23. Thus, it shall be understood that the definitions of conducting regions 30 and 31 are a function of the bias voltage and impurity types of regions of thyristor 9.

Moreover, each laterally divided region includes a wide-base portion and a narrow-base portion. In one laterally divided region the base comprises a wide-base portion 25 and a narrow-base portion 28, whereas in the other laterally divided region the base comprises a wide-base portion 27 and a narrow-base portion 26. In the single figure, wide-base portion 25 is vertically bounded by top base layer 16 and a deepest portion of bottom base well 14 and wide-base portion 27 is vertically bounded by a deepest portion of top base well 13 and by bottom base layer 17. Coupling layer 29 is common to wide-base portion 25 and wide-base portion 27, collectively forming a wide-base region. Narrow-base portion 28 is vertically bounded by top base layer 16 and a deepest portion of top emitter well 19. Narrow-base portion 26 is and vertically bounded by bottom base layer 17 and a deepest portion of bottom emitter well 20. Laterally, narrow-base portion 28 is common to top base layer 16, collectively forming a top narrow-base region. Narrow-base portion 26 is common to bottom base layer 17, collectively forming a bottom narrow-base region.

In a first embodiment, semiconductor substrate 10 is silicon having a P conductivity type, a resistivity ranging between approximately 0.9 and 100 ohm-centimeter, and a thickness ranging between approximately 200 and 250 micrometers. Preferably, in the first embodiment, a sheet resistance of base wells 13 and 14 ranges between approximately 3 and 12 ohms per square. Further, base layers 16 and 17 have an average resistivity ranging between approximately 0.025 and 0.05 ohm-centimeter, and emitter wells 19 and 20 have a sheet resistance ranging between approximately 1.5 and 6 ohms per square. Moreover, base wells 13 and 14 have a depth of approximately 90 micrometers, base layers 16 and 17 have a depth ranging between approximately 25 and 50 micrometers, and emitter wells 19 and 20 have a depth ranging between approximately 10 and 20 micrometers. Thus, base layers 16 and 17 are shallower than base wells 13 and 14, respectively.

In a second embodiment, semiconductor substrate 10 is silicon having an N conductivity type, a resistivity ranging between approximately 0.9 and 100 ohm-centimeter, and a thickness ranging between approximately 200 and 250 micrometers. Preferably, in the second embodiment, a sheet resistance of base wells 13 and 14 ranges between approximately 10 and 25 ohms per square. Further, base layers 16 and 17 have an average resistivity ranging between approximately 0.025 and 0.1 ohm-centimeter, and emitter wells 19 and 20 have a sheet resistance ranging between approximately 0.4 and 2 ohms per square.

Methods for fabricating a bidirectional two-terminal ungated thyristor and, in particular, methods for forming wells 13, 14, 19 and 20, and base layers 16 and 17 are well known to those skilled in the art. For example, in the first embodiment, base wells 13 and 14 may be formed using a diffusion technique wherein a masking layer (not shown) is formed over portions of major surfaces 11 and 12. Semiconductor substrate 10 is placed in a diffusion furnace and an impurity material of N conductivity type is pre-deposited on exposed portions of major surfaces 11 and 12. The pre-deposited impurity material may have a sheet resistance in a range of approximately 10 to 20 ohms per square. Base wells 13 and 14 are formed by driving-in the pre-deposited impurity material to a depth of, for example, 90 micrometers into semiconductor substrate 10. Base wells 13 and 14 cooperate with semiconductor substrate 10 to form PN junctions, wherein semiconductor substrate 10 serves as a coupling layer. The masking layer is then removed.

Base layers 16 and 17 are formed by placing semiconductor substrate 10 in a diffusion furnace and pre-depositing a layer of impurity material of N conductivity type on major surfaces 11 and 12. The pre-deposited impurity material may have a sheet resistance in a range of approximately 15 to 35 ohms per square. Base layers 16 and 17 are formed by driving-in the pre-deposited impurity material to a depth ranging between, for example, approximately 25 and 50 micrometers into semiconductor substrate 10. Base layers 16 and 17 cooperate with semiconductor substrate 10 to form PN junctions, wherein semiconductor substrate 10 serves as a coupling layer. Typically, base layers 16 and 17 are formed by a blanket doping of surfaces 11 and 12. Thus portions of base layers 16 and 17 are merged with base wells 13 and 14, respectively. Dashed lines 18 and 15 merely indicate the depth of the diffusion layers 16 and 17, respectively, into the respective base wells 14 and 13. Thus, dashed lines 15 and 18 further emphasize the merging of base layers 16 and 17 with the respective base wells 13 and 14. It shall be understood that the method for forming base layers 16 and 17 is not a limitation of the present invention. In other words, formation of base layers 16 and 17 may occur without a simultaneous doping of base wells 13 and 14, wherein top base layer 16 and base well 13, and bottom base layer 17 and bottom base well 14 are merged.

Emitter wells 19 and 20 are formed by masking portions of major surfaces 11 and 12. Semiconductor substrate 10 is placed in a diffusion furnace and an impurity material of N conductivity type is pre-deposited on the exposed portions of major surfaces 11 and 12. The pre-deposited impurity material may have a sheet resistance in a range of approximately 0.5 to 2 ohms per square. Emitter wells 19 and 20 are formed by driving-in the pre-deposited impurity material to a depth ranging between, for example, approximately 10 to 20 micrometers into base layers 16 and 17, respectively. Emitter wells 9 and 20 cooperate with base layers 16 and 17, respectively to form PN junctions, wherein semiconductor substrate 10 serves as a coupling layer. Top emitter well 19 is laterally spaced from top base well 13, and directly opposite bottom base well 14. Bottom emitter well 20 is laterally spaced from bottom base well 14, and directly opposite top base well 13. Preferably, emitter wells 19 and 20 include the plurality of fingers 21 and 24. The plurality of fingers 21 and 24 may be formed by preventing the diffusion of the impurity material into a plurality of portions of base layers 16 and 17 during the formation of emitter wells 19 and 20, respectively. Thus, the plurality of fingers 21 and 24 are formed from and are within base layers 16 and 17. The masking layer is then removed.

In a second example, impurity materials may be introduced into semiconductor substrate 10 using an ion implantation technique. Methods of performing ion implantation are well known to those of skill in the art.

In a third example base wells 13 and 14 are formed as an epitaxial layer. Base layers 16 and 17, and emitter wells 19 and 20 may be formed using either diffusion or ion implantation techniques. Methods of forming an epitaxial layer, and performing diffusion and ion implantation are well known to those of skill in the art.

The types of impurity material and order of introduction of the impurity materials into semiconductor substrate 10 are not a limitation of the present invention. For example, the second embodiment is realized by using a semiconductor substrate 10 of N conductivity type. For the second embodiment, base wells 13 and 14, and base layers 16 and 17 are of P conductivity type; whereas emitter wells 19 and 20 are of N conductivity type. Methods of forming base layers and base and emitter wells are well known to those skilled in the art.

A layer of conductive material 22 is formed on major surface 11 and a layer of conductive material 23 is formed on major surface 12. Layers of conductive material 22 and 23 serve as conductors or electrodes 22 and 23. Conductor 22 electrically couples top base well 13, top base layer 16, top emitter well 19, and the plurality of fingers 21. Conductor 23 electrically couples bottom base well 14, bottom base layer 17, bottom emitter well 20, and the plurality of fingers 24. Preferably, the layers of conductive material 22 and 23 comprise a layer of aluminum capped with layers of titanium, nickel, and silver. The type of conductive material is not a limitation of the present invention. Those skilled in the art are aware of many types of conducting materials and many techniques for forming conductive layers.

By now it should be appreciated that there has been provided a method for decreasing a width of the base regions in the forward and the reverse conducting semiconductor devices; thereby forming a narrow base bidirectional two-terminal thyristor. Preferably the method for decreasing the width of the base regions relies on a two step technique for introducing an impurity material: a base well doping step followed by a shallow blanket doping step wherein the base layers are formed.

Because a base width of the bidirectional two-terminal ungated thyristor is a sum of the width of the narrow-base portion and the width of the wide-base portion, decreasing the width of the wide-base portion results in a decrease in a total base width. Decreasing either the widths of the narrow-base portion or the wide-base portion decreases the total base width. However, because the width of the wide-base portion is greater than that of the narrow-base portion, decreasing the width of the wide-base portion allows a greater change in total base width. The decrease in the width of the base regions provides a lower forward voltage drop across the bidirectional two-terminal ungated thyristor. Lowering the forward voltage drop across the bidirectional two-terminal thyristor permits a higher current density in the bidirectional two-terminal thyristor without increasing its power dissipation. Further, the decrease in the width of the base regions is attained without compromising the structural integrity of the semiconductor substrate material, as may occur with conventional methods for decreasing the base width.

We claim:

1. A bidirectional two-terminal ungated thyristor, comprising:
   a semiconductor substrate of a first conductivity type having a first major surface and a second major surface;
   a first base well of a second conductivity type, the first base well extending from the second major surface into the semiconductor substrate;
   a second base well of the second conductivity type laterally spaced from the first base well, the second base well extending from the first major surface into the semiconductor substrate;
   a first base layer of the second conductivity type, the first base layer extending from the first major surface into the semiconductor substrate, wherein the first base layer extends to a shallower depth than the second base well;
   a second base layer of the second conductivity type, the second base layer extending from the second major surface into the semiconductor substrate, wherein the second base layer extends to a shallower depth than the first base well;
   a first emitter well of the first conductivity type, the first emitter well extending from the first major surface into the first base layer and having a depth shallower than the first base layer, and the first emitter well laterally spaced from the second base well and directly opposite the first base well;
   a second emitter well of the first conductivity type, the second emitter well extending from the second major surface into the second base layer and having a depth shallower than the second base layer, the second emitter well laterally spaced from the first base well and directly opposite the second base well;
   a first conductive layer on the first major surface wherein the first conductive layer electrically couples the second base well, the first emitter well, and the first base layer; and
   a second conductive layer on the second major surface wherein the second conductive layer electrically couples the first base well, the second emitter well, and the second base layer.

2. A bidirectional two-terminal ungated thyristor as claimed in claim 1 wherein a depth of the first and the second base wells is substantially 90 micrometers, the depth of the first and the second base layer ranges between approximately 25 and 50 micrometers, and the depth of the first and the second emitter wells ranges between approximately 10 and 20 micrometers.

3. A bidirectional two-terminal thyristor as claimed in claim 1 wherein the first conductivity type is P type.

4. A bidirectional two-terminal thyristor as claimed in claim 1 wherein the first emitter well includes a first plurality of fingers contiguous to the first major surface, the first plurality of fingers comprising portions of the first base layer, and the second emitter well includes a second plurality of fingers contiguous to the second major surface, the second plurality of fingers comprising portions of the second base layer.

5. A thyristor, comprising:
   a semiconductor substrate with a first major surface and a second major surface opposing the first major surface, the semiconductor substrate including a first base well of one conductivity type contiguous to the first major surface, a first base layer of the one conductivity type contiguous to the first major surface, the first base layer merged with a portion of the first base well, a second base well of the one conductivity type contiguous to the second major surface, a second base layer of the one conductivity type contiguous to the second major surface, the second base layer merged with a portion of the second base well, the first base well laterally spaced from the second base well, a first emitter well of an opposite conductivity type contiguous, on the one hand, to the first base layer, and on the other hand, to the first major surface, the first emitter well cooperating with the first base layer to form a first PN junction having a first junction depth, a second emitter well of the opposite conductivity type contiguous, on the one hand, to the second base layer, and on the other hand, to the second major surface, the second emitter well cooperating with the second base layer to form a second PN junction having the first junction depth, a coupling layer of the opposite conductivity type interposed between the first base layer and the second base well and between the second base layer and the first base well, wherein the first base layer cooperates with the coupling layer to form a third PN junction having a second junction depth, the second base layer cooperates with the coupling layer to form a fourth PN junction having the second junction depth, the first base well cooperates with the coupling layer to form a fifth PN junction having a third junction depth, and the second base well cooperates with the coupling layer to form a sixth PN junction having the third junction depth, wherein the second and third junction depths are unequal, and a depth of the first and the second PN junctions ranges between approximately 10 and 20 micrometers, a depth of the third and the fourth PN junctions ranges between approximately 25 and 50 micrometers, and a depth of the fifth and the sixth PN junctions is substantially 90 micrometers;

a first electrode in contact with the first emitter well, the first base well, and the first base layer; and a second electrode in contact with the second emitter well, the second base well, and the second base layer.

6. A thyristor, comprising:

a semiconductor substrate with a first major surface and a second major surface opposing the first major surface, the semiconductor substrate including a first base well of one conductivity type contiguous to the first major surface, a first base layer of the one conductivity type contiguous to the first major surface, the first base layer merged with a portion of the first base well, a second base well of the one conductivity type contiguous to the second major surface, a second base layer of the one conductivity type contiguous to the second major surface, the second base layer merged with a portion of the second base well, the first base well laterally spaced from the second base well, a first emitter well of an opposite conductivity type contiguous, on the one hand, to the first base layer, and on the other hand, to the first major surface, the first emitter well cooperating with the first base layer to form a first PN junction having a first junction depth, a second emitter well of the opposite conductivity type contiguous, on the one hand, to the second base layer, and on the other hand, to the second major surface, the second emitter well cooperating with the second base layer to form a second PN junction having the first junction depth, a coupling layer of the opposite conductivity type interposed between the first base layer and the second base well and between the second base layer and the first base well, wherein the first base layer cooperates with the coupling layer to form a third PN junction having a second junction depth, the second base layer cooperates with the coupling layer to form as fourth PN junction having the second junction depth, the first base well cooperates with the coupling layer to form a fifth PN junction having a third junction depth, and the second base well cooperates with the coupling layer to form a sixth PN junction having the third junction depth, wherein the first junction depth is less than the second junction depth, and the second junction depth is less than the third junction depth;

a first electrode in contact with the first emitter well, the first base well, and the first base layer; and a second electrode in contact with the second emitter well, the second base well, and the second base layer.

7. A thyristor as claimed in claim 6 wherein the first emitter region includes a plurality of shorting structures, wherein the plurality of shorting structures comprise portions of the first base layer and extend from the first major surface into the first emitter well toward the second base well to couple the first base layer to the first electrode.

8. A thyristor as claimed in claim 7 wherein the second emitter region includes a plurality of shorting structures, wherein the plurality of shorting structures comprise portions of the second base layer and couple the second base layer to the second electrode through the second emitter well.

* * * * *